United States Patent
Kim et al.

(10) Patent No.: US 11,783,883 B2
(45) Date of Patent: Oct. 10, 2023

(54) BURST MODE FOR SELF-REFRESH

(71) Applicant: Micron Technology, Inc., Boise, ID (US)

(72) Inventors: Kang-Yong Kim, Boise, ID (US); Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 158 days.

(21) Appl. No.: 17/459,446

(22) Filed: Aug. 27, 2021

(65) Prior Publication Data

US 2022/0068365 A1 Mar. 3, 2022

Related U.S. Application Data

(60) Provisional application No. 63/127,681, filed on Dec. 18, 2020, provisional application No. 63/072,692, filed on Aug. 31, 2020.

(51) Int. Cl.
*G11C 11/00* (2006.01)
*G11C 11/406* (2006.01)

(52) U.S. Cl.
CPC .............................. *G11C 11/40615* (2013.01)

(58) Field of Classification Search
CPC .......... G11C 11/406; G11C 2211/4061; G11C 11/40615; G11C 11/4076;
(Continued)

(56) References Cited

U.S. PATENT DOCUMENTS

| 8,045,365 B2 * | 10/2011 | Oh ........................ G11C 11/406 365/230.01 |
| 9,001,608 B1 | 4/2015 | Chishti et al. |

(Continued)

FOREIGN PATENT DOCUMENTS

| WO | 2022047159 | 3/2022 |
| WO | 2022047265 | 3/2022 |

OTHER PUBLICATIONS

"International Search Report and Written Opinion", Application No. PCT/US2021/048111, dated Dec. 15, 2021, 10 pages.

(Continued)

*Primary Examiner* — Thong Q Le
(74) *Attorney, Agent, or Firm* — Colby Nipper PLLC

(57) ABSTRACT

Systems, apparatuses, and methods related to a memory device, such as a low-power dynamic random-access memory (DRAM) and an associated host device are described. The memory device and the host device can include control logic that enables the host device to transmit a burst value to the memory device, which may enable the memory device, the host, or both, to manage refresh operations during a normal operation mode or a self-refresh mode. The burst value can be transmitted to the memory device in association with a command (e.g., a command directing the memory device to enter the self-refresh mode). The burst value can specify a number of self-refresh operations to be initiated at the memory device in response to receiving the command. When the specified number of self-refresh operations are completed, regular self-refresh operations may begin, with an internal self-refresh timer counting an interval to the next self-refresh operation.

32 Claims, 9 Drawing Sheets

(58) Field of Classification Search
CPC .......... G11C 11/40603; G11C 11/4074; G11C 11/408; G11C 11/4085; G11C 2211/4065; G11C 2211/4067; G11C 2211/4068; G11C 7/1018; G11C 11/40618; G11C 11/4087; G11C 7/1027; G11C 8/12; G06F 12/00
USPC .. 365/222, 149, 189.07, 230.04, 210.1, 220, 365/230.01; 711/106, 100, 105, 141, 167, 711/E12.078
See application file for complete search history.

(56) References Cited

U.S. PATENT DOCUMENTS

| | | |
|---|---|---|
| 2013/0279283 A1 | 10/2013 | Seo et al. |
| 2014/0016423 A1 | 1/2014 | Ware et al. |
| 2014/0043888 A1 | 2/2014 | Chen et al. |
| 2017/0062038 A1 | 3/2017 | Doo et al. |
| 2017/0069371 A1 | 3/2017 | Shin et al. |
| 2017/0140810 A1 | 5/2017 | Choi et al. |
| 2018/0047439 A1 | 2/2018 | Bains et al. |
| 2018/0096719 A1 | 4/2018 | Tomishima et al. |
| 2019/0130963 A1 | 5/2019 | Lee |
| 2020/0258566 A1 | 8/2020 | Schaefer et al. |

OTHER PUBLICATIONS

"International Search Report and Written Opinion", Application No. PCT/US2021/047956, dated Dec. 16, 2021, 12 pages.

"International Preliminary Report on Patentability", Application No. PCT/US2021/048111, dated Feb. 28, 2023, 7 pages.

"International Preliminary Report on Patentability", Application No. PCT/US2021/047956, dated Feb. 28, 2023, 8 pages.

"Non-Final Office Action", U.S. Appl. No. 17/458,068, dated Apr. 27, 2023, 15 pages.

* cited by examiner

| SDRAM Command | SDR CMD Pin | CA Bus 114 | | | | | | | CK_t Edge |
|---|---|---|---|---|---|---|---|---|---|
| | CS | CA0 | CA1 | CA2 | CA3 | CA4 | CA5 | CA6 | |
| SRE | H | L | L | L | H | L | H | H | R1 |
| | X | OP0 | OP1 | OP2 | V | V | DSM | PD | F1 |

400-1

| OP2 | OP1 | OP0 | Burst Value |
|---|---|---|---|
| L | L | L | 0 |
| L | L | H | 1 |
| L | H | L | 2 |
| L | H | H | 4 |
| H | L | L | 8 |
| H | L | H | 16 |
| H | H | L | 32 |
| H | H | H | 64 |

```
┌─────────────────────────────────────────────┐
│  Receive, at a memory device, a command      │
│  indicative of a burst value that specifies  │
│  a number of self-refresh operations         │
│  to be performed in response to receiving    │
│  the command                                 │
│                                              │
│                    602                       │
└─────────────────────────────────────────────┘
                      │
                      ▼
┌─────────────────────────────────────────────┐
│  Initiate at the memory device the number of │
│  self-refresh operations specified by the    │
│  burst value, responsive to receiving the    │
│  command                                     │
│                                              │
│                    604                       │
└─────────────────────────────────────────────┘
                      ┆
                      ▼
┌─────────────────────────────────────────────┐
│  Remain in a self-refresh mode after         │
│  performing the number of self-refresh       │
│  operations specified by the burst value     │
│                                              │
│                    606                       │
└─────────────────────────────────────────────┘
```

Determine a number of refresh operations for a memory device

702

Transmit to the memory device a command indicative of a burst value that specifies a number of self-refresh operations to be performed at the memory device in response to receiving the command

704

Direct the memory device, via the command, to remain in a self-refresh mode after completing the number of self-refresh operations specified with the burst value

BURST MODE FOR SELF-REFRESH

CROSS-REFERENCE TO RELATED APPLICATION(S)

This application claims the benefit of U.S. Provisional Application No. 63/072,692, filed Aug. 31, 2020, and U.S. Provisional Application No. 63/127,681, filed Dec. 18, 2020, the disclosures of which are hereby incorporated by reference in their entireties herein.

BACKGROUND

Computers, smartphones, and other electronic devices operate using processors and memories. A processor executes code based on data to run applications and provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random-access memory (RAM) and flash memory, respectively. RAM can include static RAM (SRAM) and dynamic RAM (DRAM).

Demands on the different types of memory continue to evolve and grow. For example, as processors are engineered to execute code faster, such processors can benefit from more-quickly accessing memories. Applications may also operate on ever-larger data sets that use ever-larger memories. Due to battery-powered electronic devices and power-hungry data centers, energy-usage constraints are becoming more prevalent for memory systems. Further, manufacturers may seek smaller memories as the form factors of portable electronic devices continue to shrink. Accommodating these various demands is complicated by the diverse strengths and capabilities of different types of memories.

BRIEF DESCRIPTION OF THE DRAWINGS

The details of one or more aspects of burst mode for self-refresh are described in this document with reference to the following drawings. The same numbers are used throughout the drawings to reference like features and components:

FIG. 3-1 illustrates an example operating diagram that depicts aspects of how burst mode for self-refresh can be implemented with a memory device or a host device;

FIG. 3-2 illustrates an example comparison diagram, which depicts aspects of how a host device and a memory device that do not implement burst mode for self-refresh operate relative to the operation of the host and memory devices of FIG. 3-1;

FIG. 4 illustrates an example command truth table and an example look-up table that depict additional details related to the example operating diagram of FIG. 3-1;

FIG. 5-1 illustrates an example timing diagram that depicts example operations of a host device and a memory device in accordance with example implementations of the described techniques and apparatuses for burst mode for self-refresh;

FIG. 5-2 illustrates another example comparison diagram, which depicts aspects of how a host device and a memory device that do not implement burst mode for self-refresh operate relative to the operation of the host and memory devices of FIG. 5-1; and FIG. 6 and FIG. 7 illustrate example methods for an apparatus to implement aspects of burst mode for self-refresh.

DETAILED DESCRIPTION

Overview

Figure 1:
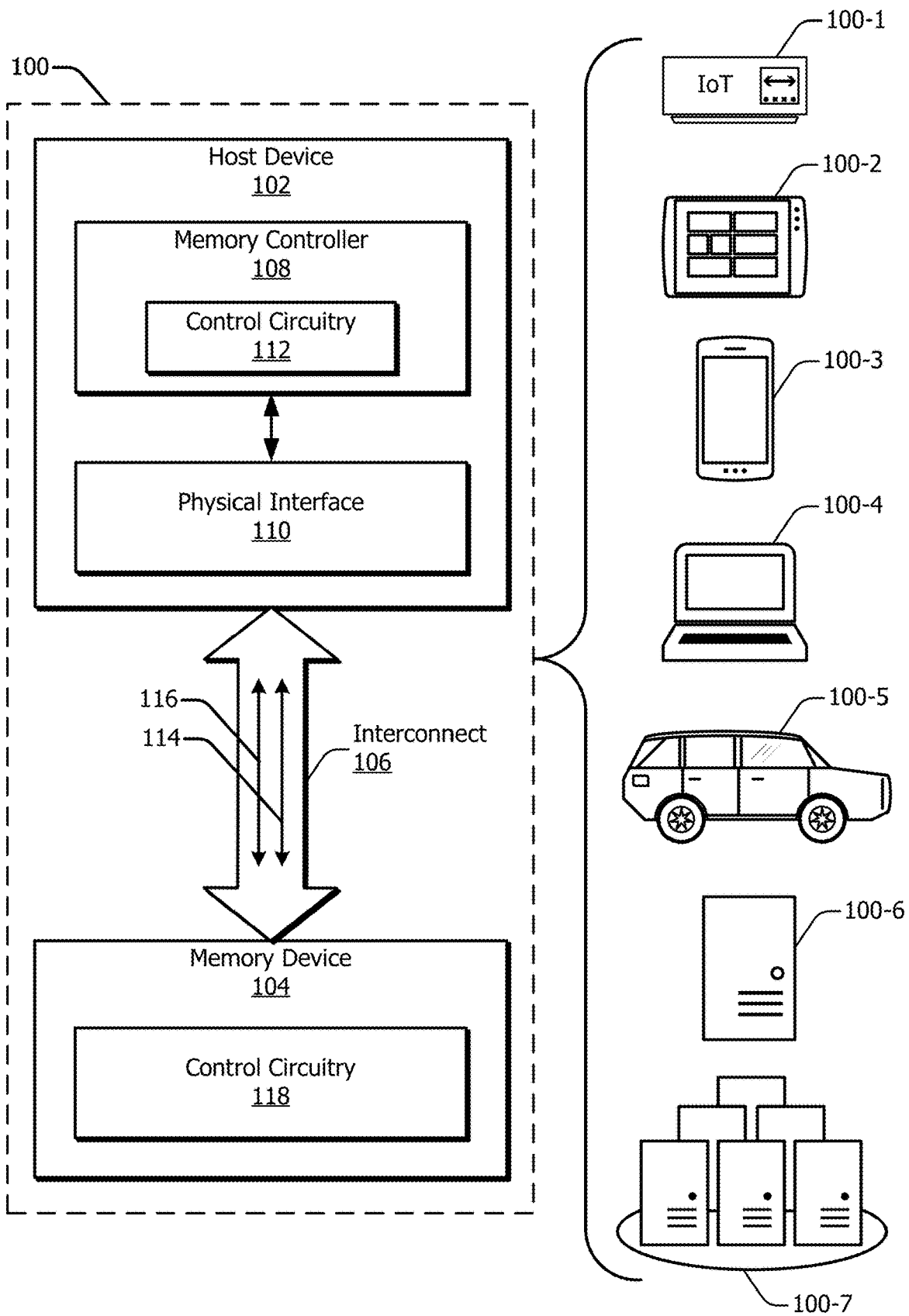
FIG. 1 illustrates an example apparatus that can implement aspects of burst mode for self-refresh.

For some applications, such as portable electronic devices that operate on battery power and data centers that employ thousands of memory devices, further reducing power usage for next-generation low-power memory can provide appreciable improvements in efficiency. These applications may also benefit from increasing memory performance by reducing memory access latency or periods of memory unavailability. Some implementations that are described herein can provide one or both advantages for memory, including low-power memory types.

Double data rate synchronous dynamic random-access memory (DDR SDRAM), including low-power DDR (LPDDR) SDRAM, is a volatile memory, which means that the stored information is lost if power is not maintained. Because the memory cells of volatile memory are made in part from capacitors, the charge slowly drains from the memory cells and the data can be lost if the capacitor is not recharged. Therefore, to maintain an appropriate charge, the memory cells are periodically refreshed. To perform a refresh operation, the memory reads data from a memory cell corresponding to a refresh address into a temporary storage (e.g., a sense amp) and writes the data back to the memory cell with the proper charge. A refresh address can include memory cell addresses, rows addresses, bank addresses, and the like. Refresh operations may be initiated and controlled by a memory controller outside of the memory (e.g., using an auto-refresh command) or by operations performed internally (e.g., using a self-refresh operation).

Generally, each memory cell in a volatile memory is refreshed at least once within a refresh interval referred to as tREF (e.g., approximately 32 milliseconds or approximately 64 milliseconds) to maintain the integrity of stored data. The memory controller may therefore issue a refresh command (e.g., an auto-refresh command) that corresponds to or includes one all-bank refresh (ABR) command or multiple per-bank refresh (PBR) commands, depending on the bank configuration (e.g., 4Bank/4BG mode, 8Bank mode, or 16Bank mode). The memory controller can issue the refresh command at a frequency sufficient to refresh each memory cell of a given memory array within the relevant interval. When the memory is in a power-saving mode (e.g., a self-refresh mode), the memory performs the self-refresh operations at a similar rate or frequency.

The rate or frequency at which the refresh and self-refresh commands are issued can be based on triggers such as a time interval (e.g., a fraction of tREF) or on operations the memory controller or the memory device are performing. For example, an interval between refresh commands may be between approximately 3.9 microseconds (µs) and approximately 16 µs (e.g., approximately 4, approximately 8, or approximately 16 µs). The memory controller can include a refresh timer that is used to keep track of the refresh intervals for refresh commands. During the self-refresh periods, however, the memory controller and other host device components (e.g., communication or other interfaces) may be idle, so the memory device manages the refresh intervals for self-refresh operations using an internal self-refresh timer. Because a self-refresh operation may be missed if the memory controller issues a self-refresh exit command toward the end of a self-refresh interval, another independent refresh command may be issued by the memory controller between a self-refresh exit and a subsequent self-refresh entry.

The processing and computing capabilities of electronic devices, especially mobile devices like smartphones and tablets, have dramatically increased over the last few years. Multiple cores on a processing chip and multiple cameras on the device are common, along with other sensors and components that enable powerful applications. Not only do these increased capabilities require more power, but they generate and use more data. This may lead to additional periods of heavy workloads for the memory system (e.g., an increased amount of activations, pre-charge operations, reads, and/or writes for a memory array). Consequently, reducing power consumption, increasing data rates, and reducing latency can improve the customer experience.

Generally, during refresh operations, the host device (e.g., a memory controller) cannot access at least a portion of the memory. All or most of the memory cells may be inaccessible during an all-bank refresh, and at least a portion of the memory cells may be inaccessible during a per-bank refresh. This affects system-level performance because the host processor can be sending read and write requests that the memory controller cannot fulfill during refresh operations. For example, the memory controller has a queue, which can be a cache or buffer memory that queues and stores read/write requests and other commands. During periods of heavy memory workload, read and write requests can fill the queue while the memory cells cannot be accessed because of refresh operations. In some cases, if the number of memory requests and commands exceeds the memory capacity of the queue, the memory controller may ignore some read or write requests, which can adversely affect system performance and the user's experience.

One approach to address this condition is to use per-bank refresh operations (e.g., REFpb) rather than all-bank refresh operations (e.g., REFab), which leaves at least some memory accessible during the per-bank refresh. Another approach is to allow the memory controller to postpone one or more refresh operations or commands. For example, during a period of heavy workload, multiple scheduled refresh commands (e.g., auto-refresh commands from the memory controller that are determined according to a schedule for memory refreshing) may be postponed according to a defined schedule (e.g., a schedule defined in a JEDEC standard, such as a JEDEC LPDDR5 or LPDDR6 standard). Another technique that can be used is to proactively advance or "pull-in" (or preemptively "pull-forward") some refresh operations during normal operations, which can allow a same or similar number of refresh operations to be skipped later (e.g., during a period of heavy workload). With the postponed or preemptively advanced techniques, however, there may be limitations on how many refresh operations can be postponed or preemptively performed in advance within a given time frame (e.g., based on a standard or another basis).

Additionally, while per-bank refresh can be useful, there may still be periods of heavy workload during which a higher volume of read/write requests is directed to a bank that is being refreshed. Similarly, postponing refresh operations can provide short-term relief, but only a defined number of refresh operations can be postponed before the memory controller must catch up by performing all or at least some of the postponed refresh operations back to back without interruption. Further, postponing techniques, pull-in techniques, and REFpb commands involve transmitting commands and performing refresh operations while in a normal operation mode, which is a relatively higher-power mode compared to a self-refresh mode.

In contrast, consider the following discussion of techniques for taking advantage of the benefits of burst mode for self-refresh, which may be implemented as part of a volatile-memory architecture or protocol, including an LPDDR architecture or protocol, such as a post-LPDDR5 memory. In the described techniques, when the memory controller uses postponed refresh techniques to accommodate heavy workloads, a burst value can be associated or included with another command, including a self-refresh command (e.g., the SRE command). The burst value can specify or indicate a number of catch-up self-refresh operations that are to be performed back-to-back upon entry to the self-refresh mode. Because refresh operations in the self-refresh mode may use less power than those performed in a normal operational mode (e.g., those instituted using an auto-refresh command, a REFab command, or an REFpb command), power consumption may be reduced by entering the self-refresh mode before accounting for postponed refresh operations. Further, because the refresh operations are performed in the self-refresh mode, the command bus has increased bandwidth for other commands (e.g., to another module, die, or bank) because an instruction to perform the catch-up refresh operations can be sent all at once in association with a single command, rather than with one command per refresh operation.

Consider an example implementation of the described techniques for burst mode for self-refresh in which an LPDDR or other memory device operates using a protocol in which a self-refresh command includes or is associated with a burst value. The burst value indicates or specifies a number of self-refresh operations to be performed in response to receiving a self-refresh entry command (e.g., at the beginning of a self-refresh mode entered in response to a command such as SRE). Responsive to the memory device receiving the self-refresh command, the memory device performs the appropriate number of self-refresh operations (e.g., all-bank refresh or per-bank refresh operations) specified by the burst value. When the specified number of self-refresh operations have been completed, regular self-refresh operations may begin, and a self-refresh timer that is internal to the memory device begins counting an interval to the next self-refresh operation.

The described burst mode for self-refresh techniques may also be implemented to pull in or advance refresh operations in self-refresh mode (e.g., preemptively pull-forward refresh operations in anticipation of an upcoming heavy workload period). For example, in a case in which there are no postponed refresh operations to account for, the memory controller can issue the self-refresh command that includes, indicates, or is associated with the burst value. In response to the command, the memory device can perform the appropriate number of refresh operations (e.g., as defined by the burst value) back to back, effectively "pulling in" that number of refresh operations and allowing subsequent postponing of scheduled refresh operations. In these manners, the described burst mode for self-refresh techniques can reduce the number of refresh operations that are performed during normal memory operation before, during, and/or after heavier workloads for the memory system. This can reduce power consumption and may also lead to improved system performance (e.g., by increasing available bandwidth on the command bus, by reducing latency, or by increasing data rate) while maintaining memory reliability through timely and complete refresh operations.

Example Apparatuses and Systems

FIG. 1 illustrates an example apparatus 100 that can implement aspects of burst mode for self-refresh to save power, decrease latency, and improve reliability. The described implementations are applicable to memory generally, including those that may comport with an LPDDR memory specification, which may include post-LPDDR5 memory specifications (e.g., LPDDR6). Example implementations of the apparatus 100 include an internet-of-things (IoTs) device 100-1; a tablet device 100-2; a smartphone 100-3; a notebook computer 100-4; an automobile 100-5; a server computer 100-6; a server cluster 100-7 that may be part of cloud computing infrastructure or a data center; a portion thereof (e.g., a printed circuit board (PCB)); and/or the like. Other apparatus examples include a wearable device, such as a computing watch smart-glasses or other eyewear; an entertainment device, such as a set-top box, a smart television, or an audio system; a vehicle or drone; a personal device such as a track pad, drawing pads, netbook, or e-reader; a home security system; a motherboard or server blade; industrial equipment; or a network-attached storage (NAS) device. Note that these electronic devices (e.g., computing devices) can be wearable, non-wearable but mobile, or relatively immobile (e.g., desktops or appliances).

In example implementations, the apparatus 100 includes a host device 102, a memory device 104 (e.g., a volatile memory device), and an interconnect 106. The host device 102 may be implemented with any of a variety of different integrated circuit chips, including a system-on-chip (SoC), an application-specific integrated circuit (ASIC), or an application-specific standard part (ASSP). As shown, the host device 102 also includes a memory controller 108 and a physical interface (PHY) 110. The host device 102 may include other components that are not shown in FIG. 1. For example, the host device 102 may include one or more processors (e.g., a CPU, a GPU, or other core processor), one or more memories (e.g., a cache memory or a buffer memory), or one or more communication systems (e.g., interconnects, memory channels, or input/output (I/O) hardware or firmware).

The host device 102 may also include control circuitry 112. Although shown in FIG. 1 as included with the memory controller 108, the control circuitry 112 may be separate from the memory controller 108 and may be distributed across one or more other devices or dies. The control circuitry 112 can determine a burst value that specifies or indicates a number of self-refresh operations to be performed at the memory device 104 in response to receiving a command directing the memory device 104 to enter a self-refresh mode (e.g., a self-refresh entry command, such as an SRE command). In some implementations, the control circuitry 112 can determine the burst value based at least in part on a number of refresh commands that the host device 102 delayed or postponed prior to transmitting the command (e.g., the burst value can be a same or similar number as the number of delayed or postponed refresh operations). The control circuitry 112 can transmit the burst value in association with the command directing the memory device 104 to enter a self-refresh mode. For example, the control circuitry 112 can transmit the burst value to the memory device 104 as part of the self-refresh entry command (e.g., using one or more bits of the command) or as a separate transmission in conjunction with the self-refresh entry command (e.g., at or near the time the self-refresh entry command is transmitted). Thus, the burst value may form part of the self-refresh entry command or at least part of another signal or command.

These techniques can reduce the number of refresh operations performed during normal operation, which can reduce power consumption and may also lead to improved system performance. For example, the techniques allow some refresh operations to be performed in the self-refresh mode rather than in the normal operation mode. This can include refresh operations corresponding to refresh commands that were delayed or postponed during normal operations (e.g., during a period of heavy workload or other conditions that may be addressed by postponing or delaying refresh commands). Shifting refresh operations to self-refresh operations can save power because, for instance, some components of the host device and/or the memory device may be idle or off during the self-refresh mode. Further, latency and other performance measures may be improved because the techniques can enable increased bandwidth on the command bus (e.g., rather than sending a command for each refresh operation, the postponed or delayed refresh operations can be communicated at once via the burst value). These advantages can be achieved while maintaining memory reliability through timely and complete refresh operations.

In some implementations, the burst value can be used to pull in or advance self-refresh operations. For example, in a case in which no refresh operations are delayed or postponed during normal operation, the control circuitry 112 can determine a burst value and issue the command that includes or is indicative of the burst value (e.g., the self-refresh command). The memory device 104 can then enter the self-refresh mode and perform the appropriate number of refresh operations, as specified by the burst value. Preemptively performing these refresh operations effectively "pulls in" the number of refresh operations indicated by the burst value, which can enable subsequent postponing of scheduled refresh operations during the normal operation mode. In this implementation, the control circuitry 112 can determine the burst value based on a number of factors, including historical refresh requirements, historical workload data, projected workload, standards-imposed requirements (e.g., a limit or maximum number of refresh operations that can be pulled in under a standard such as JEDEC LPDDR5 or LPDDR6), and so forth. In this way, the described techniques that enable the burst mode for self-refresh can also be used to take advantage of times during normal operations that have a lighter workload. By instructing the memory device 104 to enter the self-refresh mode and perform the pulled-in refresh operations specified by the burst value, the host device 102 can then skip that number of refresh operations during a later time period in normal operation with a heavier workload.

The memory controller 108 may be realized with any of a variety of suitable memory controllers (e.g., a DDR memory controller that can process requests for data stored on the memory device 104). The physical interface 110 may be realized as any of a variety of suitable physical interfaces that can transfer data between the memory controller 108 and the memory device 104 using the interconnect 106. For example, the physical interface 110 may be an interface that is compatible with a DDR PHY Interface (DFI) Group interface protocol. The memory controller 108 and the physical interface 110 may be coupled, directly or indirectly, to each other. The memory controller 108 and the physical interface 110 may also be coupled, directly or indirectly, to one or more other components included in the host device 102.

The interconnect 106 may be implemented with any of a variety of interconnects that communicatively couple together various components and enable data to be transferred between or among the various components. The interconnect 106 may include a bus, a switching fabric, one or more wires or traces that carry voltage or current signals, and so forth. In the example apparatus 100, the interconnect 106 may be separated into at least a command-and-address (CA) bus 114 and a data (DQ) bus 116 (e.g., for CA and DQ pins, respectively, on the memory device 104). In some implementations, the interconnect 106 may also include a chip-select (CS) I/O (not shown) that can be coupled to, for example, one or more CS pins on the memory device 104. The interconnect 106 may also include or be able to communicate through a power-down (PDE/X) pin and/or a deep-sleep mode (DSM) pin. In some implementations, the interconnect 106 may be realized as a combination of any two or more of the examples described herein.

Further, the electrical paths or couplings realizing the interconnect 106 can be shared between two or more memory components (e.g., dies, banks, bank groups, and so forth). In some implementations, the CA bus 114 is used only for transmitting addresses and commands from the memory controller 108 to the memory device 104. In other implementations, the CA bus 114 may be bidirectional and/or may propagate at least other control information. The DQ bus 116 can transmit data between the memory controller 108 and the memory device 104 bidirectionally. The memory device 104 may be realized with any suitable memory and/or storage facility including, but not limited to: Dynamic Random-Access Memory (DRAM), Synchronous DRAM (SDRAM), three-dimensional (3D) stacked DRAM, Double Data Rate (DDR) memory, or Low-Power DDR (LPDDR) memory. The memory device 104 may be configured with multiple memory cards or sticks, multiple memory dies, multiple memory arrays, multiple memory banks, combinations thereof, and so forth.

The memory device 104 may also include or be in electronic communication with control circuitry 118. The control circuitry 118 can receive or otherwise access a burst value that specifies or indicates a number of self-refresh operations to be initiated or performed in response to the memory device 104 receiving a command from the host device 102 (e.g., a command directing the memory device to enter a self-refresh mode). The burst value may be received at the memory device 104 in association with the command from the host device 102. For example, the burst value may be included with the command (e.g., defined by one or more bits of the command) or received via a separate signal or other command at or near a time the command is transmitted. For example, in response to receiving the command that indicates the burst value, the control circuitry 118 can access the burst value and cause the memory device 104 to enter the self-refresh mode. The control circuitry 118 can then initiate the number of self-refresh operations specified by the burst value. The self-refresh operations may include refreshing one or more of multiple memory cards or sticks, multiple memory dies, multiple memory arrays, or multiple memory banks (not shown in FIG. 1) of the memory device 104. After completing the number of self-refresh operations indicated by the burst value, the control circuitry 118 can direct the memory device 104 to remain in the self-refresh mode. Regular self-refresh operations may then begin in which a self-refresh timer that is internal to the memory device begins counting an interval to the next self-refresh operation.

In some implementations, the burst value may be included with the command via the CA bus 114 using one or more bits. These one or more bits may be unused or available in a definition of the command under a current memory standard, such as LPDDR5. Alternatively, the one or more bits may be part of a new memory-refresh-related command, may be transmitted over the interconnect 106 separately from a memory refresh or self-refresh command, and so forth.

Figure 2:
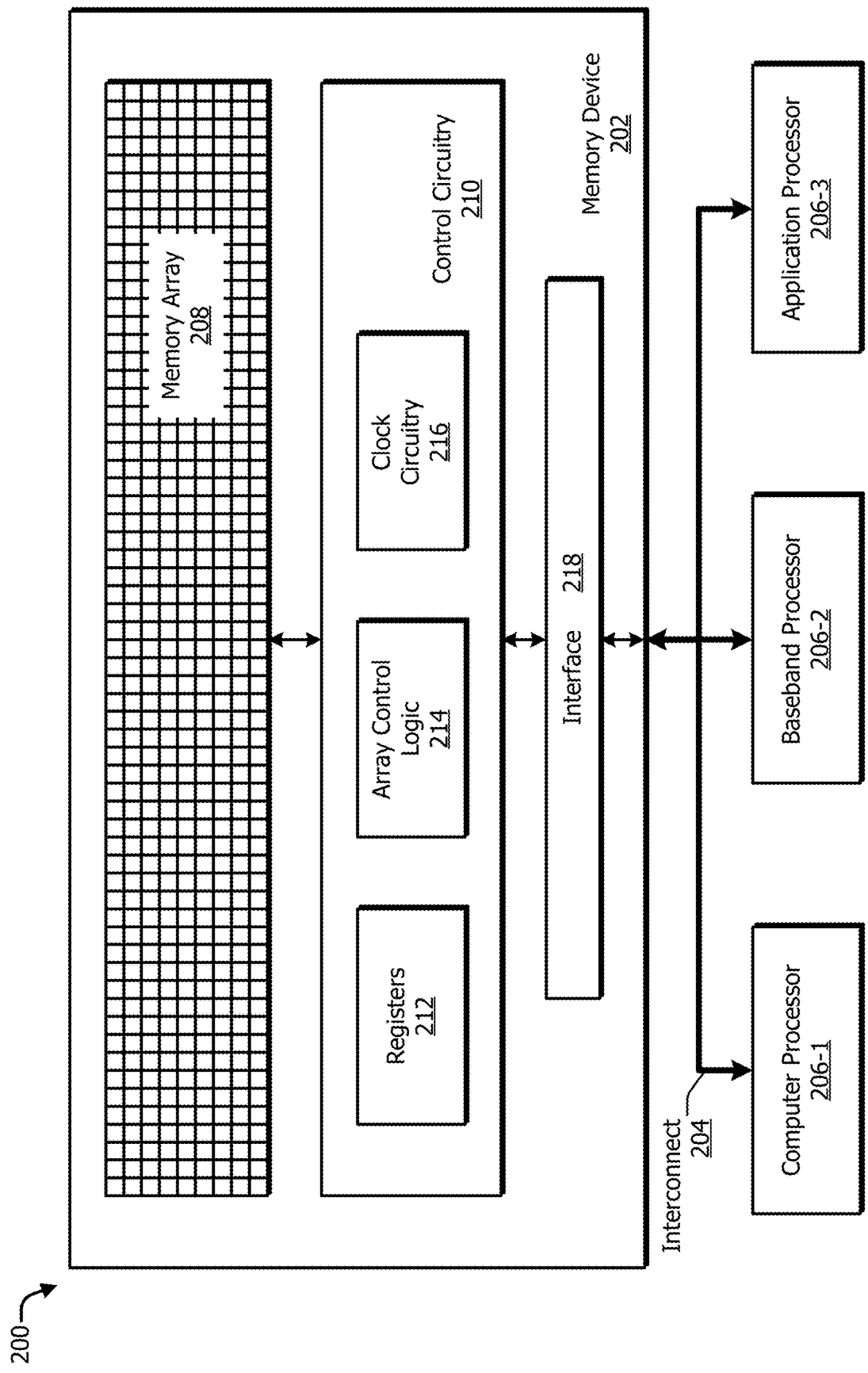
FIG. 2 illustrates an example computing system that can implement aspects of burst mode for self-refresh.

FIG. 2 illustrates an example computing system 200 that can implement aspects of burst mode for self-refresh. In some implementations, the computing system 200 includes at least one memory device 202, at least one interconnect 204, and at least one processor 206. The memory device 202 can include, or be associated with, at least one memory array 208, at least one interface 218, and control circuitry 210 that is communicatively coupled to the memory array 208. The memory device 202 can correspond to the memory device 104 of FIG. 1, and the control circuitry 210 can correspond to the control circuitry 118 of FIG. 1. Thus, the memory array 208 can include an array of memory cells, including but not limited to memory cells of Dynamic Random-Access Memory (DRAM), Synchronous DRAM (SDRAM), three-dimensional (3D) stacked DRAM, Double Data Rate (DDR) memory, or Low-Power DDR (LPDDR) SDRAM. The memory array 208 and the control circuitry 210 may be components on a single semiconductor die or on separate semiconductor dies. The memory array 208 or the control circuitry 210 may also be distributed across multiple dies.

The control circuitry 210 can include any of a number of components that can be used by the memory device 202 to perform various operations (e.g., communicate with other devices, manage performance, and perform memory read or write operations). For example, the control circuitry 210 can include one or more registers 212, at least one instance of array control logic 214, and clock circuitry 216. The registers 212 may be implemented, for example, as one or more registers that can store information to be used by the control circuitry 210 or another part of the memory device 202. The array control logic 214 may be implemented as circuitry that can provide command decoding, address decoding, input/output functions, amplification circuitry, power supply management, power control modes, and other functions. The clock circuitry 216 may be implemented as circuitry that can provide synchronization of various components of the memory device 202 with one or more external clock signals that may be provided over the interconnect 204, such as a command/address clock (e.g., CK_t or CK_c) or a data clock (e.g., WCK_t or WCK_c), and/or with at least one clock signal that is generated internally.

The interface 218 can couple the control circuitry 210 or the memory array 208 directly or indirectly to the interconnect 204. As shown in FIG. 2, the registers 212, the array control logic 214, and the clock circuitry 216 can be part of a single component (e.g., the control circuitry 210). In other implementations, one or more of the registers 212, the array control logic 214, or the clock circuitry 216 may be implemented as separate components, which can be provided on a single semiconductor die or disposed across multiple semiconductor dies. These components of the control circuitry 210 may be individually or jointly coupled to the interconnect 204 via the interface 218.

The interconnect 204 may be implemented with any one or more of a variety of interconnects that communicatively couple together various components and enable commands, addresses, and/or other information and data to be transferred between two or more of the various components (e.g., between the memory device 202 and the one or more processors 206). For example, the interconnect 204 may be realized as the interconnect 106 described with reference to FIG. 1 or may be implemented in a manner similar to the interconnect 106. Although the interconnect 204 is represented with a single arrow in FIG. 2, the interconnect 204 may include a bus, a switching fabric, one or more wires or traces that carry voltage or current signals, at least one switch, one or more buffers, and so forth. Further, the interconnect 204 may be separated into at least a command-and-address (CA) bus and a data bus (as depicted in FIG. 1).

In some aspects, the memory device 202 may be realized as a "separate" physical component relative to the host device 102 of FIG. 1 or any of the processors 206. Examples of physical components, which may be separate, include: a printed circuit board (PCB), which can be rigid or flexible; a memory card; a memory stick; a memory module, including a single in-line memory module (SIMM) or a dual in-line memory module (DIMM); and so forth. Alternatively, the memory device 202 may be packaged or integrated with other physical components, including the host device 102 or a processor 206, such as by being combined on a common PCB or together in a single device package.

The apparatuses and methods that are described herein may be appropriate for memory that is designed for lower-power operations or that is targeted for energy-efficient applications. Thus, the described principles may be incorporated into a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards or versions thereof, like the LPDDR5 standard, for clarity. The described principles, however, are also applicable to memories that comport with other standards, including other LPDDR standards (e.g., earlier versions or future versions like LPDDR6), and to memories that do not adhere to a public standard.

As shown in FIG. 2, the one or more processors 206 may include a computer processor 206-1, a baseband processor 206-2, and an application processor 206-3, which are coupled to the memory device 202 through the interconnect 204. The processors 206 may each be a CPU, a GPU, an SoC, an ASIC, an FPGA, or the like. In some cases, a single processor comprises multiple processing resources, each dedicated to different functions, such as modem management, applications, graphics, central processing, or the like. In some implementations, the baseband processor 206-2 may include or be coupled to a modem (not shown in FIG. 2) and may be referred to as a modem processor. The modem and/or the baseband processor 206-2 may be coupled wirelessly to a network via, for example, cellular, Wi-Fi®, Bluetooth®, near field, or another technology or protocol for wireless communication.

In some implementations, the processors 206 may be connected directly to the memory device 202 (e.g., via the interconnect 204). In other implementations, one or more of the processors may be indirectly connected to the memory device 202 (e.g., over a network connection, over multiple interconnects, or through one or more other devices). Further, a respective processor 206 can include or be associated with a respective memory controller, like the memory controller 108 depicted in FIG. 1. Alternatively, two or more processors 206 may access the memory device 202 using a shared or system memory controller 108.

In some implementations, the control circuitry 210 may also provide additional memory features, such as features or services similar to or the same as those provided by the control circuitry 118 as described with reference to FIG. 1. For example, the control circuitry 210 can receive or access a burst value that specifies or indicates a number of self-refresh operations to be performed in response to the memory device 202 receiving a command from the one or more processors 206 or the host device 102. In some implementations, the refresh operations to be performed in accordance with the burst value correspond to refresh operations that were postponed or delayed during normal memory operation (e.g., because of a heavier workload).

The burst value may be received at the memory device 202 in association with the command from the one or more processors 206 or the host device 102 (e.g., can be included with the command or transmitted at or near a same time as the command). For example, in response to the memory device 202 receiving a command directing the memory device 202 to enter a self-refresh mode, the control circuitry 210 can access the burst value associated with the command and cause the memory device 202 to enter the self-refresh mode and perform the number of self-refresh operations indicated by the burst value. The self-refresh operations may include refreshing one or more cells of the memory array 208. After completing the number of self-refresh operations indicated by the burst value, the control circuitry 210 can direct the memory device 202 to remain in the self-refresh mode. Regular self-refresh operations may then begin in which a self-refresh timer that is internal to the memory device 202 begins counting an interval to the next self-refresh operation.

In some implementations, these features may be enabled in response to the command received from one of the processors 206 (or the host device 102) over the interconnect 204 (or the interconnect 106). In other implementations, these features can be enabled in response to an externally applied signal voltage, clock signal, other command, or other signal or in response to the memory device 202 detecting a change in an operating mode (e.g., a beginning or ending of an operating mode, such as a self-refresh mode), a register setting, or an environmental condition.

These features and services, including receiving and accessing the burst value and performing postponed or advanced refresh operations in the self-refresh mode instead of in the normal operation mode, may lead to fewer refresh operations being performed in the normal operation mode. Reducing the number of refresh operations that are performed in the normal operation mode can reduce power consumption and may improve system performance (e.g., by reducing latency, by increasing command bus bandwidth, and/or by increasing data rate) while maintaining memory reliability through timely and complete refresh operations.

Example Operating Schemes

Figures 1, 3:
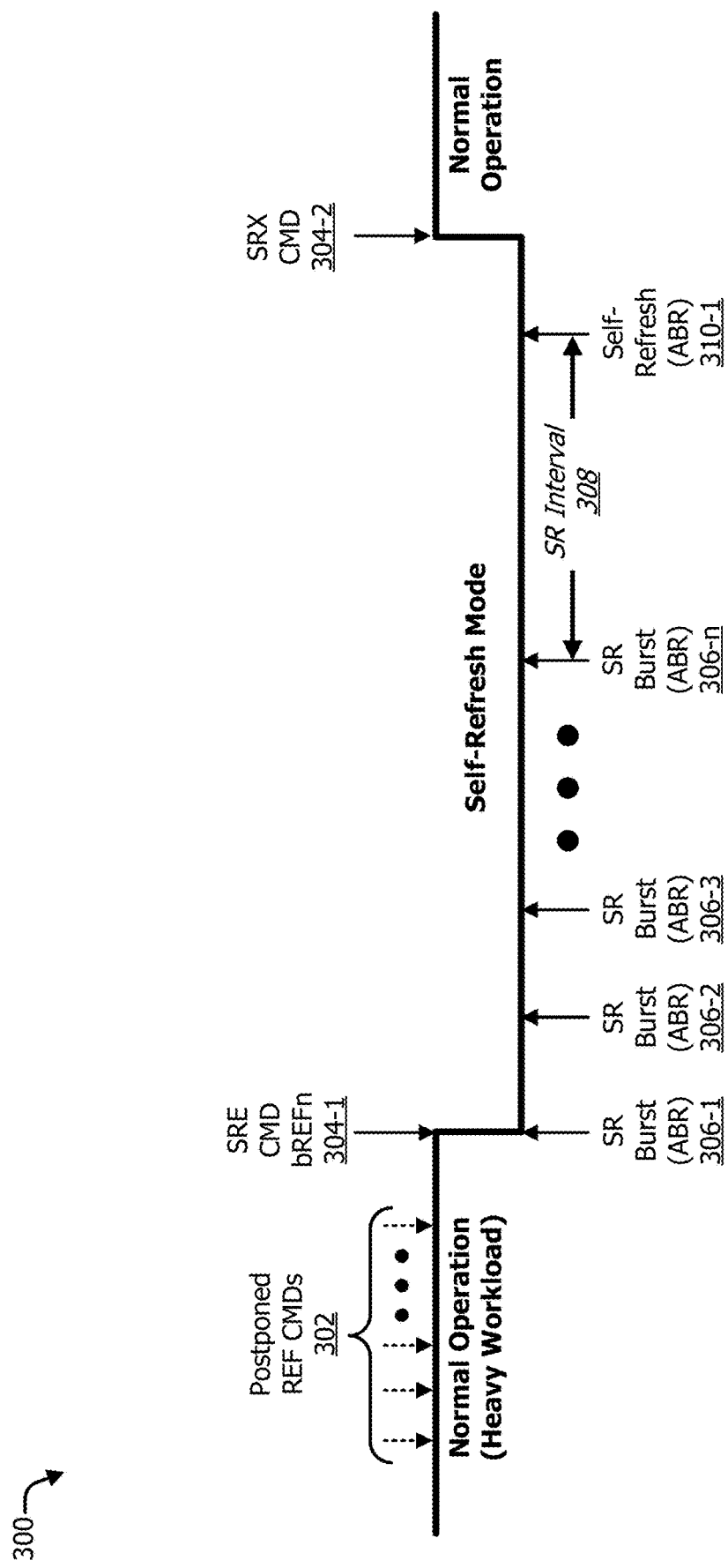
Figures 2, 3:
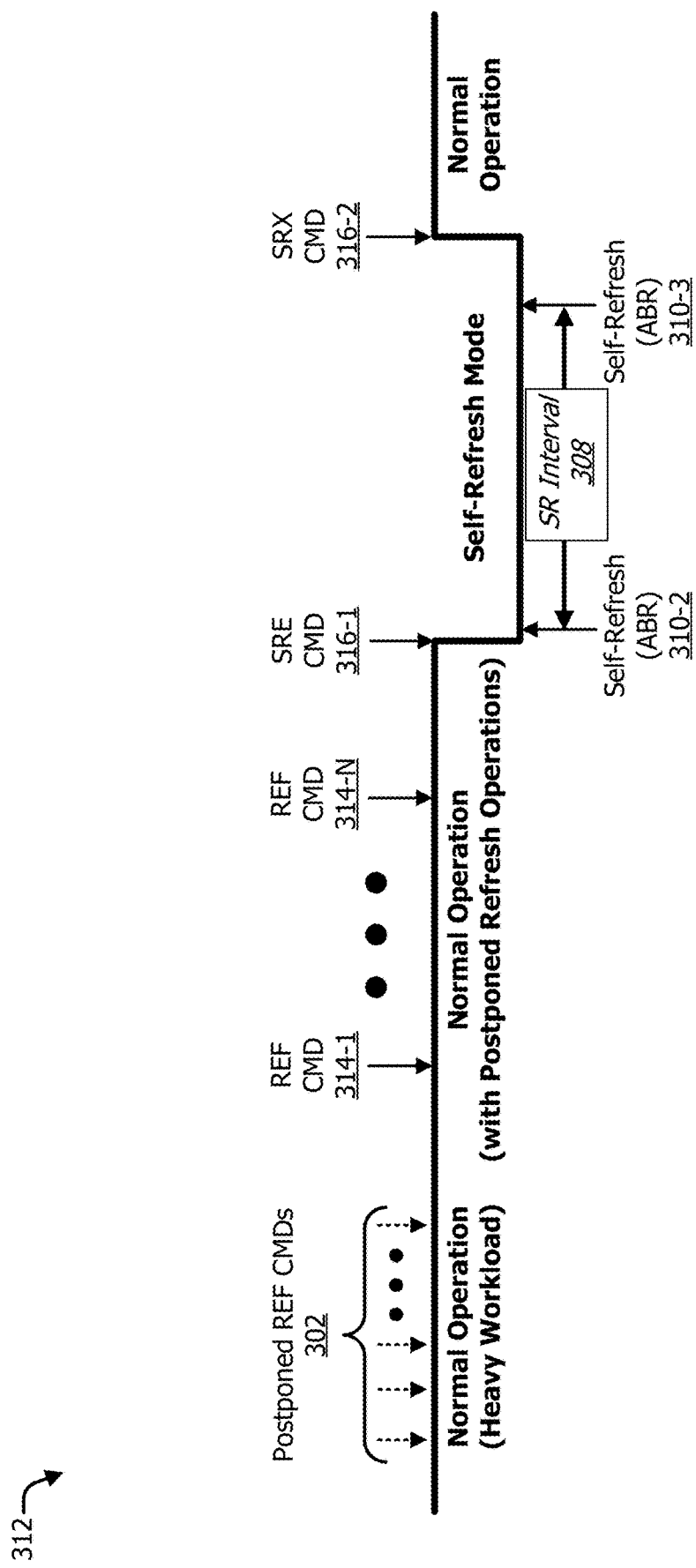

FIG. 3-1 illustrates an example operating diagram 300 that depicts aspects of how burst mode for self-refresh can be implemented in a memory device and/or a host device. The details of the example operating diagram 300 are described with reference to the host device 102 and the memory device 104, but the details are applicable to other apparatuses, DRAM memory systems, and devices, including the memory device 202 and the one or more processors 206. The example operating diagram 300 begins with the memory device 104 in a normal operation mode with a heavy workload (e.g., an increased amount of activations, pre-charge operations, reads, and/or writes). In normal operation with a heavy workload, the memory controller 108

(or another device) may postpone some refresh commands (e.g., REFab or REFpb commands), as shown by dashed-line arrows labeled postponed refresh commands 302 (postponed REF CMDs 302). The postponed refresh commands 302 represent commands for scheduled refresh operations (e.g., REFab or REFpb commands that become due to be performed based on a refresh timer of the host device 102). As shown in the example operating diagram 300, the host device 102 issues a self-refresh entry command with burst mode (SRE CMD bREFn) 304-1 (e.g., responsive to the number of postponed refresh operations reaching a limit or maximum allowable number, or responsive to an opportunity to enter a self-refresh mode). The SRE CMD bREFn 304-1 includes or otherwise indicates a burst value that specifies a number n of self-refresh operations to be performed upon entering the self-refresh mode. The burst value may, for instance, correspond to the number of postponed REF CMDs 302.

The SRE CMD bREFn 304-1 can provide the burst value using a signal on the CA bus 114. One example approach to providing the burst value is shown in FIG. 4 at 400, which illustrates an example command truth table 400-1 and an example look-up table 400-2. These tables depict one way the CA bus 114 may be used to transmit the burst value, n. In the example of FIG. 3-1, the burst value specifies how many self-refresh operations should be performed back-to-back (e.g., in a burst) before the memory device 104 begins operating in the regular self-refresh mode. The command truth table 400-1 shows that pins CA0, CA1, and CA2, for instance, are designated to provide the burst value by setting a value (e.g., Low (L) or High (H)) for each pin, CA0-CA2, which correspond respectively to operands OP0, OP1, and OP2. The look-up table 400-2 provides example values of operands OP0, OP1, and OP2 that can be used to define or indicate the burst value (e.g., a variable n indicating a number of SR burst operations 306-1 . . . 306-n). For example, if the values of OP0-OP2 are all set to L, the burst value is zero (e.g., no back-to-back self-refresh operations are to be performed upon entry to the self-refresh mode). When the values of OP0 and OP2 are set to H and the value of OP1 is set to L, the burst value is 16 (e.g., 16 back-to-back self-refresh operations are to be performed upon entry to the self-refresh mode).

In FIG. 4, the illustrated selection and number of designated pins in the command truth table 400-1, as well as the burst values (e.g., 0-64) in the look-up table 400-2, are illustrative of merely one example for using the CA bus 114 to transmit the burst value. This example provides one instance of how LPDDR5 can be extended to incorporate burst mode for self-refresh. Future LPDDR specifications (e.g., LPDDR6) may incorporate the principles of burst mode for self-refresh as described herein differently, such as with new commands or different pin assignments. Depending on various factors, such as the configuration of the memory device and the CA bus, other numbers and combinations of pins and operands may be used to provide the self-refresh burst information in other environments.

Returning now to FIG. 3-1, the memory device 104 enters the self-refresh mode in response to receiving the SRE CMD bREFn 304-1. Because the SRE CMD bREFn 304-1 also includes the burst value n in this example, the memory device 104 performs n back-to-back self-refresh operations (e.g., all-bank or per-bank refresh operations) upon entering the self-refresh mode, as shown by SR Burst (ABR) operations 306-1 through 306-n. When the SR Burst (ABR) operations 306-1 through 306-n are complete, the memory device 104 begins to operate in the regular self-refresh mode, and the internal self-refresh timer begins counting time for a self-refresh interval (SR interval) 308 until a regular self-refresh operation, ABR 310-1, is performed. The SR interval 308 may be any suitable interval (e.g., between approximately 3.9 microseconds (µs) and approximately 16 µs). When self-refresh (ABR) 310 is complete (or started), the internal self-refresh timer begins counting time for another self-refresh interval 308. As shown for this example, before the end of the next SR interval 308, the host device 102 issues a self-refresh exit command (SRX CMD) 304-2. In response to the SRX CMD 304-2, the memory device 104 exits the self-refresh mode and resumes normal operation.

The operating diagram 300 depicts example aspects of how burst mode for self-refresh can be implemented in a memory device and a host device. In contrast, FIG. 3-2 illustrates an example comparison diagram 312, which depicts aspects of how a host device and a memory device that do not implement burst mode for self-refresh operates relative to the operation of the host and memory devices of FIG. 3-1. The advantages of burst mode for self-refresh as illustrated in FIG. 3-1 can be seen via the example comparison diagram 312 of FIG. 3-2, which illustrates operation of another host device and another memory device that do not implement burst mode for self-refresh (e.g., but that may otherwise be similar to the host device 102 and the memory device 104, respectively). In the example comparison diagram 312, some elements of the example operating diagram 300 may be omitted or altered for clarity.

In the example depicted in the comparison diagram 312, the other host device and the other memory device are operating in a normal operation mode with a heavy workload. Accordingly, the memory controller 108 postpones some refresh commands, as shown by dashed-line arrows labeled postponed REF CMDs 302. These dashed-line arrows, therefore, represent commands for scheduled refresh operations (e.g., REFab or REFpb operations that were due to be performed based on a refresh timer of the host device 102). As shown in the example comparison diagram 312, when there are no additional postponed refresh operations or the number of postponed refresh operations has reached a limit (e.g., the number of postponed refresh operations has reached a limit or another maximum allowable number), the other memory device remains in the normal operation mode and other host device issues a series of back-to-back refresh commands 314 (e.g., REF CMD 314-1 through 314-N) to account for the postponed refresh operations.

At an appropriate time, after the postponed refresh commands are accounted for, the other host device may issue a self-refresh entry command (SRE CMD) 316-1. The other memory device performs a regular self-refresh operation ABR 310-2 immediately upon entering the self-refresh mode and another regular self-refresh operation ABR 310-3 after the SR interval 308 expires. The other host device next issues a self-refresh exit command (SRX CMD) 316-2. In response to the SRX CMD 316-2, the other memory device exits the self-refresh mode and resumes normal operation. As shown in the example comparison diagram 312, the other memory device performs more refresh operations in the normal operation mode, relative to the memory device 104, to account for the postponed refresh operations during the heavy workload period. The other host device is thus sending more refresh commands (e.g., auto-refresh commands) across an interconnect to the other memory device to cause these additional refresh operations to occur during the normal operation mode. As described herein, additional operations in the normal operation mode may increase power consumption and adversely affect system performance (e.g., latency, read/write accuracy, and so forth).

Figures 1, 5:
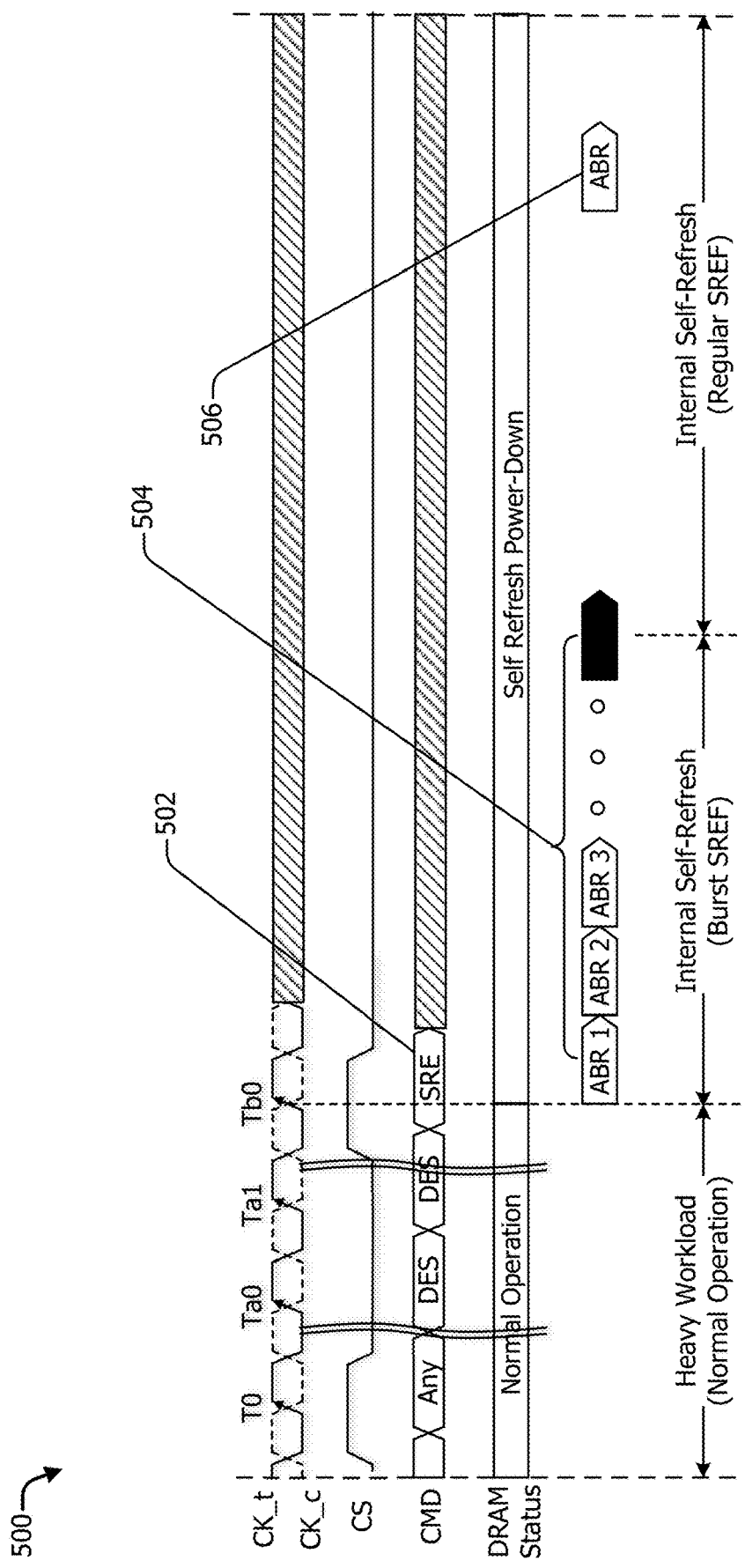
Figures 2, 5:
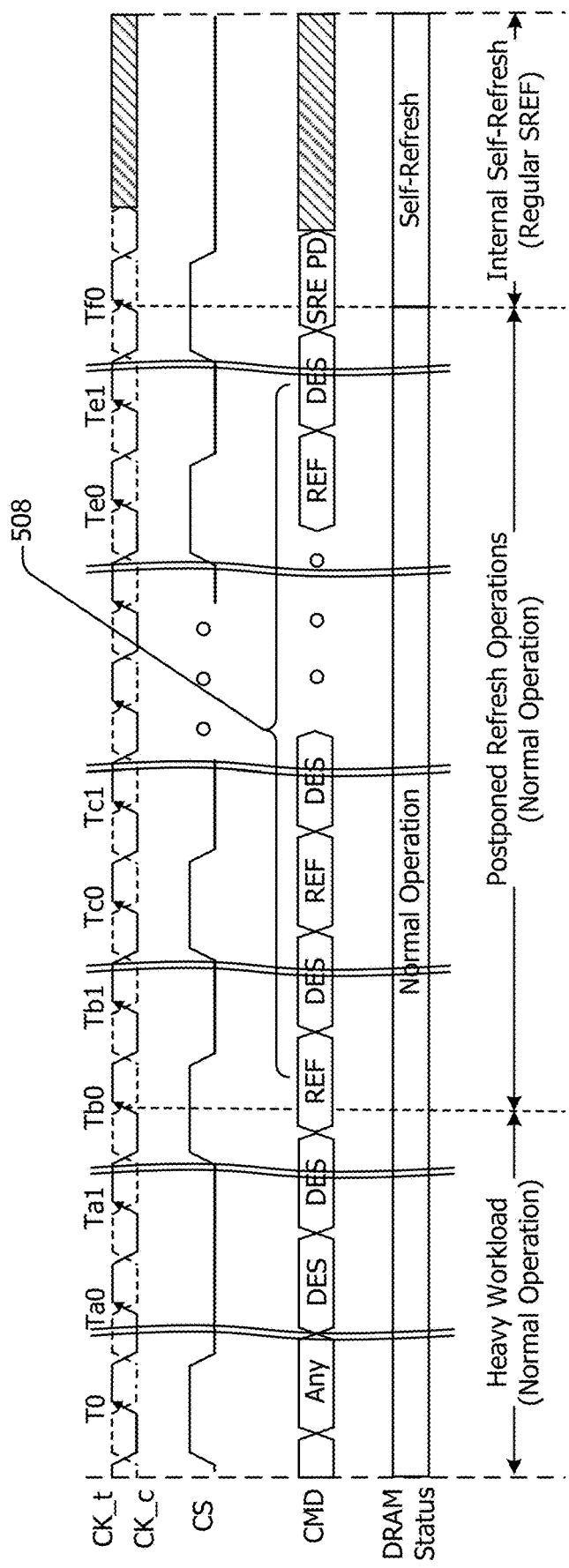

FIG. 5-1 depicts an example timing diagram 500, which illustrates example operations of a host device and a memory device in accordance with example implementations of the described techniques and apparatuses that enable burst mode for self-refresh. The example timing diagram 500 illustrates a case in which the memory device (e.g., the memory device 104 or 202) is in a normal operation mode with a heavy workload (e.g., a higher volume of read/write requests than is typical). In this example, the host device has delayed or postponed a number, n, of regularly scheduled refresh commands to the memory device during the heavy workload (e.g., the host device has postponed n refresh commands).

At time Tb0, the host device (e.g., the memory controller 108 of the host device 102 or the processors 206) issues a command 502 directing the memory device to enter a self-refresh mode, such as an SRE command. In the illustrated example, the command 502 includes the burst value, as described with reference to FIGS. 1 through 3-1 and FIG. 4 (e.g., the command 502 may be a command similar to the SRE CMD bREFn 304-1 of FIG. 3-1). After the command 502 is received, the memory device 104 can enter the self-refresh mode and initiate the n postponed self-refresh operations 504 indicated by the burst value. When the n postponed self-refresh operations are complete, the memory device can remain in the self-refresh mode and initiate one or more regular self-refresh operations 506 based on, for example, a timer internal to the memory device 104.

The timing diagram 500 depicts example aspects of how burst mode for self-refresh can be implemented in a memory device and a host device. In contrast, FIG. 5-2 illustrates another example comparison diagram 512, which depicts aspects of how another host device and another memory device that do not implement burst mode for self-refresh operate relative to the operation of the host and memory devices of FIG. 5-1. The advantages of burst mode for self-refresh can be seen in FIG. 5-1 via the other example comparison diagram 512 of FIG. 5-2, which illustrates operations of another host device and another memory device that do not implement burst mode for self-refresh (e.g., but that may otherwise be similar to the host device 102 or processor 206 or the memory device 104 or 202, respectively). In the other example comparison diagram 512, some elements of the example timing diagram 500 may be omitted or altered for clarity.

In the example depicted in the other comparison diagram 512, the other memory device is operating in the normal operation mode with a heavy workload. The other host device has also delayed or postponed n refresh commands. At time Tb0, when there are no additional postponed refresh operations or the number of postponed refresh operations has reached a limit (e.g., the number of postponed refresh operations has reached a limit or another maximum allowable number), the other memory device remains in the normal operation mode, and the other host device issues a series of back-to-back refresh commands 508 to account for the postponed refresh operations (e.g., the n refresh commands). At time Tf0, after the postponed refresh commands are accounted for, the other host device may issue a self-refresh entry command. Responsive to this command, the other memory device enters the regular self-refresh mode. As illustrated in the example comparison diagram 512, the other memory device performs more fresh operations in the normal operation mode, relative to the memory device 104 illustrated in FIG. 5-1, to account for the postponed refresh operations during the heavy workload period.

The example operating diagram 300, the example comparison diagram 312, the example timing diagram 500, and the other example comparison diagram 512 illustrate one of several advantages of using the described burst mode for self-refresh techniques and apparatuses, which is reducing the number of refresh operations performed during the normal operation mode. Many components of the host device 102 (or the processors 206) and the memory device 104 (or 202) may be in an idle or off state (e.g., memory controllers, interfaces, registers, and other circuitry) while the memory device is in the self-refresh mode. Consequently, performing refresh operations while in the self-refresh mode (e.g., rather than in the normal operation mode) can reduce power consumption while maintaining memory reliability through timely and complete refresh operations.

Further, performing refresh operations while in the self-refresh mode may also lead to improved system performance (e.g., by increasing bandwidth on the command bus, by reducing latency, and by increasing data throughput). Another advantage that can be provided by burst mode for self-refresh is related to multiple-die configurations of the memory device 104. In these configurations, the CA bus 114 may be shared between two or more dies, and commands can be directed to the different dies using a chip-select (CS) bit. In this case, to issue a command to each die, the host device issues the command on CS0 and on CS1. If, for example, the die on CS0 postpones n refresh operations and then enters self-refresh with a command that includes the burst value, the host device 102 does not need to issue multiple (e.g., n) refresh commands to CS0. The host device 102 can therefore access the die on CS1 while the die on CS0 is refreshing, even though the CA bus 114 may be shared with the die on CS0, which is in self-refresh and inaccessible. This may improve overall system performance while saving power and maintaining an appropriate refresh schedule. This document now turns toward example methods for implementing burst mode for self-refresh.

EXAMPLE METHODS

FIG. 6 and FIG. 7 illustrate example methods 600 and 700 for an apparatus to implement burst mode for self-refresh. The following discussion may reference components or techniques described with reference to the example apparatus 100, the example operating diagram 300, the example timing diagram 500, or the example tables 400-1 and 400-2. These references in the descriptions of FIG. 6 and FIG. 7 are made only by way of example. The methods 600 and 700 may, for example, refer to a host device and a memory device. In either or both methods, the memory device may be the memory device 104 or 202, as described with reference to FIG. 1 and FIG. 2, respectively. Similarly, the host device may be the host device 102 or any one or more of the processors 206, as described with reference to FIG. 1 and FIG. 2, respectively.

At 602, a memory device receives a command that is associated with or indicative of a burst value. The burst value indicates or specifies a number of self-refresh operations to be performed in response to receiving the command. The command may be a command that directs the memory device to enter a self-refresh mode (e.g., a self-refresh entry command, such as the SRE command). The command may also include one or more features described with reference to the SRE CMD bREFn 304-1 of FIG. 3-1.

In some implementations, the memory device may receive the burst value with the command (e.g., as a part of the self-refresh entry command, such as by using one or more bits of the command). For example, the burst value may be part of a command such as the SRE CMD bREFn 304-1. Alternatively, the memory device may receive the burst value as part of a separate transmission (e.g., a separate command or another signal) received in conjunction with the command that is received (e.g., received at or near the time the SRE command is received).

At 604, the memory device initiates the number of self-refresh operations specified by the burst value in response to receiving the command. For example, the memory device 104 or 202 can perform the n self-refresh operations (e.g., all-bank or per-bank refresh operations) specified by the burst value upon entering the self-refresh mode, as described with reference to FIGS. 1 through 3-1.

Optionally, at 606, the memory device may remain in the self-refresh mode in response to performing the number of self-refresh operations specified by the burst value. For example, after performing the number of self-refresh operations specified with the burst value, the memory device may remain in the self-refresh mode (e.g., a regular self-refresh mode).

Turning now to the method 700, at 702, a host device determines a number of refresh operations for a memory device. For example, the host device can determine the number of refresh operations for the memory device based on a number of refresh operations that have been postponed due to a heavy workload or based on a number of refresh operations that are to be preemptively advanced due to a predicted heavy workload.

At 704, the host device transmits to the memory device a command indicating a burst value that specifies a number of self-refresh operations to be performed at the memory device in response to receiving the command. In some implementations, the command may be a command that directs the memory device to enter a self-refresh mode (e.g., a self-refresh entry command, such as the SRE command) and may include one or more features described with reference to the SRE CMD bREFn 304-1 of FIG. 3-1.

In some implementations, the burst value may correspond to a number of refresh commands that the host device postponed (e.g., during a period of heavy workload). In this case, the host device may refrain from issuing the postponed commands because the memory device will initiate or perform a corresponding number of self-refresh operations in response to the command and indicated burst value. In other implementations, the burst value may correspond to a number of refresh commands that are to be pulled in or advanced ahead of their regularly scheduled time, as described with reference to FIG. 1. Again, the host device may refrain from issuing the pulled-in or advanced commands because the memory device will initiate or perform a corresponding number of self-refresh operations in response to the command and indicated burst value. The number of commands that are to be pulled in or delayed may be determined based on any of a number of factors, including historical refresh requirements, historical or projected workload data (e.g., in anticipation of a period of heavy workloads), a limit defined in a memory standard, and so forth.

Thus, the number of self-refresh operations indicated by the burst value can be based on the number of refresh operations determined at 702. For instance, the number of self-refresh operations may be equivalent to the number of refresh operations. Additionally or alternatively, the number of self-refresh operations may be greater than a number of postponed or advanced refresh operations (e.g., if the host adds one or two more operations to account for potential memory system latencies or interconnect bottlenecks) or may be less than a number of postponed or advanced refresh operations (e.g., if the host removes an operation from the burst value because the memory device is programmed to start a following self-refresh mode with a self-refresh operation).

The host device may transmit the burst value with the command (e.g., as a part of the command, using one or more bits of the self-refresh command). For example, the burst value may be part of a command such as the SRE CMD bREFn 304-1. Alternatively, the memory device may receive the burst value as part of a separate transmission (e.g., a separate command or another signal) received at or near the time the command is received.

Optionally, at 706, the host device may direct the memory device, via the command, to remain in the self-refresh mode after completing the number of self-refresh operations specified with the burst value. For example, the command may direct the memory to enter the self-refresh mode, initiate the specified number of self-refresh operations, and then begin regular self-refresh operations according to the self-refresh timer internal to the memory device.

Aspects of these methods may be implemented in, for example, hardware (e.g., fixed-logic circuitry or a processor in conjunction with a memory), firmware, or some combination thereof. The methods may be realized using one or more of the apparatuses or components shown in FIGS. 1 through 3-1, 4, and 5-1, the components of which may be further divided, combined, rearranged, and so on. The devices and components of these figures generally represent firmware or the actions thereof hardware, such as electronic devices, packaged modules, IC chips, or circuits; software; or a combination thereof. In some cases, the host device or the memory device may individually perform the operations described with reference to FIGS. 1 to 1-3, FIG. 4, and FIG. 5-1. In other cases, the host device and the memory device may jointly perform the described operations. Thus, these figures illustrate some of the many possible systems or apparatuses capable of implementing the described methods.

Several example implementations are described below.

Example 1: A method, comprising: determining a number of refresh operations for a memory device; and transmitting to the memory device a command indicative of a burst value that specifies a number of self-refresh operations to be performed at the memory device in response to receiving the command.

Example 2: The method of example 1, further comprising: determining the number of refresh operations for the memory device based on a number of refresh operations that have been postponed.

Example 3: The method of any preceding example, further comprising: determining the number of refresh operations for the memory device based on a number of refresh operations that are to be advanced.

Example 4: The method of any preceding example, wherein the number of self-refresh operations is based on the number of refresh operations.

Example 5: The method of any preceding example, wherein the number of self-refresh operations is equivalent to the number of refresh operations.

Example 6: The method of any preceding example, wherein the command directs the memory device to enter a self-refresh mode.

Example 7: The method of any preceding example, wherein the command further directs the memory device to remain in the self-refresh mode after performing the number of self-refresh operations specified by the burst value.

Example 8: The method of any preceding example, wherein the command comprises the burst value.

Example 9: The method of any preceding example, further comprising: transmitting the burst value to the memory device using one or more bits of the command.

Example 10: The method of any preceding example, further comprising: transmitting, in conjunction with the transmitting of the command, the burst value to the memory device via a signal that is separate from the command.

Example 11: The method of any preceding example, further comprising: postponing of a number of scheduled commands directing the memory device to perform a refresh operation, wherein the burst value is based on the number of scheduled commands; and refraining from issuing the scheduled commands.

Example 12: The method of any preceding example, further comprising: determining a number of commands that direct the memory device to perform a refresh operation and that can be performed ahead of a schedule, wherein the burst value is based on the number of commands that can be performed ahead of the schedule.

Example 13: The method of any preceding example, further comprising: determining the number of commands that can be performed ahead of the schedule based on at least one of: historical refresh requirements, historical workload data, a projected workload, or a limit defined in a memory standard.

Example 14: A method, comprising: receiving a command at a memory device, the command indicative of a burst value that specifies a number of self-refresh operations to be performed in response to receiving the command; and initiating at the memory device the number of self-refresh operations specified by the burst value responsive to receiving the command.

Example 15: The method of example 14, further comprising: receiving the burst value with the command.

Example 16: The method of examples 14 or example 15, wherein the burst value is indicated using one or more bits of the command.

Example 17: The method of any of examples 14-16, further comprising: receiving, in conjunction with the receiving of the command, the burst value via a signal that is separate from the command.

Example 18: The method of any of examples 14-17 further comprising: entering, by the memory device, a self-refresh mode responsive to receiving the command.

Example 19: The method of any of examples 14-18, further comprising: remaining in the self-refresh mode after performing the number of self-refresh operations specified by the burst value.

Example 20: A host device, comprising: an interface; and control circuitry coupled to the interface, the control circuitry configured to: transmit to a memory device a command indicative of a burst value that specifies a number of self-refresh operations to be performed at the memory device in response to receiving the command.

Example 21: The host device of example 20, wherein the command directs the memory device to enter a self-refresh mode.

Example 22: The host device of example 20 or example 21, wherein the control circuitry is further configured to: transmit the burst value to the memory device using one or more bits of the command.

Example 23: The host device of any of examples 20-22, wherein the control circuitry is further configured to: transmit the burst value to the memory device via a signal that is separate from the command in conjunction with transmission of the command.

Example 24: The host device of any of examples 20-23, wherein the control circuitry is further configured to direct the host device to: postpone of a number of scheduled commands directing the memory device to perform a refresh operation, wherein the burst value is based on the number of scheduled commands that are postponed; and refrain from issuing the scheduled commands.

Example 25: The host device of any of examples 20-24, wherein the control circuitry is further configured to: determine a number of scheduled commands directing the memory device to perform a refresh operation that can be performed ahead of a schedule, wherein the burst value is based on the number of scheduled commands; and refrain from issuing the scheduled commands.

Example 26: The host device of any of examples 20-25, wherein the control circuitry is further configured to: determine the number of scheduled commands that can be performed ahead of the schedule based on at least one of: historical refresh requirements, historical workload data, a projected workload, or a limit defined in a memory standard.

Example 27: The host device of any of examples 20-26, wherein the control circuitry is further configured to determine the burst value.

Example 28: The host device of any of examples 20-27, wherein the control circuitry is further configured to: determine the burst value based on at least one of a number of postponed refresh operations or a number of advanced refresh operations.

Example 29: A memory device, comprising: at least one memory array; and control circuitry coupled to the at least one memory array, the control circuitry configured to: access a burst value that specifies a number of self-refresh operations to be performed in response to receiving a command; cause the memory device to enter a self-refresh mode responsive to the command; and initiate, for the at least one memory array, the number of self-refresh operations specified by the burst value.

Example 30: The memory device of example 29, wherein the burst value is received via one or more bits of the command.

Example 31: The memory device of example 29 or example 30, wherein the burst value is received in conjunction with reception of the command via a signal that is separate from the command.

Example 32: The memory device of any of examples 29-31, wherein the control circuitry is further configured to: cause the memory device to remain in the self-refresh mode after performing the number of self-refresh operations specified by the burst value.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" or "one or more of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for burst mode for self-refresh have been described in language specific to certain features and/or methods, the subject of the appended claims is not necessarily limited to the specific features or methods described. Rather, the specific features and methods are disclosed as example implementations for burst mode for self-refresh.

What is claimed is:

1. A method, comprising:
   determining a number of refresh operations for a memory device, the number of refresh operations including one or more of:
   a number of scheduled per-bank refresh operations that can be postponed;
   a number of scheduled all-bank refresh operations that can be postponed;
   a number of scheduled per-bank refresh operations that can be advanced; or
   a number of scheduled all-bank refresh operations that can be advanced; and
   transmitting to the memory device a command indicative of a burst value that specifies a number of self-refresh operations to be performed at the memory device in response to receiving the command.

2. The method of claim 1, wherein the number of self-refresh operations is based on the number of refresh operations.

3. The method of claim 2, wherein the number of self-refresh operations is equivalent to the number of refresh operations.

4. The method of claim 1, wherein the command directs the memory device to enter a self-refresh mode.

5. The method of claim 4, wherein the command further directs the memory device to remain in the self-refresh mode after performing the number of self-refresh operations specified by the burst value.

6. The method of claim 1, wherein the command comprises the burst value.

7. The method of claim 6, further comprising:
   transmitting the burst value to the memory device using one or more bits of the command.

8. The method of claim 1, further comprising:
   transmitting, in conjunction with the transmitting of the command, the burst value to the memory device via a signal that is separate from the command.

9. The method of claim 1, further comprising:
   determining a number of scheduled commands directing the memory device to perform the number of scheduled per-bank or all-bank refresh operations that can be postponed, wherein the burst value is based on the number scheduled per-bank or all-bank refresh operations that can be postponed; and
   refraining from issuing the scheduled commands.

10. The method of claim 1, further comprising:
    determining a number of commands that direct the memory device to perform the number of scheduled per-bank refresh operations that can be advanced, wherein the burst value is based on the number of scheduled per-bank refresh operations that can be advanced; and
    refrain from issuing the commands.

11. The method of claim 10, further comprising:
    determining the number of commands that direct the memory device to perform the number of scheduled per-bank refresh operations that can be advanced based on at least one of: historical refresh requirements, historical workload data, a projected workload, or a limit defined in a memory standard.

12. A method, comprising:
    receiving a command at a memory device, the command indicative of a burst value that specifies a number of self-refresh operations to be performed in response to receiving the command, the number of self-refresh operations to be performed in response to receiving the command being associated with one or more of:
    a number of scheduled per-bank or all-bank refresh operations that can be postponed; or
    a number of scheduled per-bank or all-bank refresh operations that can be performed ahead of schedule; and
    initiating at the memory device the number of self-refresh operations specified by the burst value responsive to receiving the command.

13. The method of claim 12, further comprising:
    receiving the burst value with the command.

14. The method of claim 13, wherein the burst value is indicated using one or more bits of the command.

15. The method of claim 12, further comprising:
    receiving, in conjunction with the receiving of the command, the burst value via a signal that is separate from the command.

16. The method of claim 12, further comprising:
    entering, by the memory device, a self-refresh mode responsive to receiving the command.

17. The method of claim 16, further comprising:
    remaining in the self-refresh mode after performing the number of self-refresh operations specified by the burst value.

18. The method of claim 2, wherein the number of self-refresh operations is greater than the number of refresh operations.

19. The method of claim 2, wherein the number of self-refresh operations is less than the number of refresh operations.

20. The method of claim 12, wherein the number of self-refresh operations is:
    greater than the number of refresh operations; or
    less than the number of refresh operations.

21. A host device, comprising:
    an interface; and
    control circuitry coupled to the interface, the control circuitry configured to:
    transmit to a memory device a command indicative of a burst value that specifies a number of self-refresh operations to be performed at the memory device in response to receiving the command, the number of self-refresh operations to be performed at the memory device in response to receiving the command being associated with one or more of:
    a number of scheduled per-bank or all-bank refresh operations that can be postponed; or
    a number of scheduled per-bank or all-bank refresh operations that can be performed ahead of a schedule.

22. The host device of claim 21, wherein the command directs the memory device to enter a self-refresh mode.

23. The host device of claim 22, wherein the control circuitry is further configured to:

transmit the burst value to the memory device using one or more bits of the command.

24. The host device of claim 22, wherein the control circuitry is further configured to:
transmit the burst value to the memory device via a signal that is separate from the command in conjunction with transmission of the command.

25. The host device of claim 22, wherein the control circuitry is further configured to direct the host device to:
determine a number of scheduled commands directing the memory device to perform the number of scheduled per-bank or all-bank refresh operations that can be postponed, wherein the burst value is based on the number of scheduled per-bank or all-bank refresh operations that can be postponed; and
refrain from issuing the scheduled commands.

26. The host device of claim 22, wherein the control circuitry is further configured to direct the host device to:
determine a number of scheduled commands directing the memory device to perform the number of scheduled per-bank or all-bank refresh operations that can be performed ahead of the schedule, wherein the burst value is based on the number of scheduled per-bank or all-bank refresh operations that can be performed ahead of the schedule; and
refrain from issuing the scheduled commands.

27. The host device of claim 26, wherein the control circuitry is further configured to:
determine the number of scheduled commands directing the memory device to perform the number of scheduled per-bank or all-bank refresh operations that can be performed ahead of a schedule based on at least one of: historical refresh requirements, historical workload data, a projected workload, or a limit defined in a memory standard.

28. The host device of claim 22, wherein the control circuitry is further configured to determine the burst value.

29. A memory device, comprising:
at least one memory array; and
control circuitry coupled to the at least one memory array, the control circuitry configured to:
access a burst value that specifies a number of self-refresh operations to be performed in response to receiving a command, the number of self-refresh operations to be performed being associated with one or more of:
a number of scheduled per-bank or all-bank refresh operations that can be postponed; or
a number of scheduled per-bank or all-bank refresh operations that can be performed ahead of a schedule;
cause the memory device to enter a self-refresh mode responsive to the command; and
initiate, for the at least one memory array, the number of self-refresh operations specified by the burst value.

30. The memory device of claim 29, wherein the burst value is received via one or more bits of the command.

31. The memory device of claim 29, wherein the burst value is received in conjunction with reception of the command via a signal that is separate from the command.

32. The memory device of claim 29, wherein the control circuitry is further configured to:
cause the memory device to remain in the self-refresh mode after performing the number of self-refresh operations specified by the burst value.

* * * * *